United States Patent [19]

Murphy

[11] Patent Number: 5,291,994
[45] Date of Patent: Mar. 8, 1994

[54] SLIDE TAB CARRIER FOR FLATPACK ELECTRONIC COMPONENT CARRIERS

[75] Inventor: Robert H. Murphy, Merrimack, N.H.

[73] Assignee: R. H. Murphy Co., Inc., Amherst County, N.H.

[21] Appl. No.: 2,222

[22] Filed: Jan. 8, 1993

[51] Int. Cl.⁵ ............................................. B65D 73/02
[52] U.S. Cl. ................................. 206/331; 206/328; 206/334; 206/560
[58] Field of Search .............. 206/328, 329, 331, 334, 206/477, 480, 483, 488, 560

[56] References Cited

U.S. PATENT DOCUMENTS

| 3,417,865 | 12/1968 | Suverkropp et al. | 206/564 |
|---|---|---|---|
| 3,604,557 | 9/1971 | Cedrone . | |
| 3,652,974 | 3/1972 | Tems . | |
| 4,379,505 | 4/1983 | Alemanni . | |
| 4,409,733 | 10/1983 | Alemanni . | |
| 4,444,309 | 4/1984 | Morton, Jr. . | |
| 4,535,887 | 8/1985 | Egawa . | |
| 4,549,651 | 10/1985 | Alemanni . | |
| 4,556,144 | 12/1985 | Putnam . | |
| 4,591,053 | 5/1986 | Alemanni . | |
| 4,620,632 | 11/1986 | Alemanni . | |
| 4,643,234 | 2/1987 | Alemanni . | |
| 4,715,835 | 12/1987 | Matsuoka | 206/328 |
| 4,747,383 | 5/1988 | Grabbe . | |
| 4,767,984 | 8/1988 | Bakker . | |
| 4,881,639 | 11/1989 | Matsuoka et al. | 206/560 |
| 4,901,853 | 2/1990 | Maryatt | 206/334 |
| 4,991,714 | 2/1991 | Clatanoff . | |
| 5,026,303 | 6/1991 | Matsuoka et al. . | |
| 5,080,228 | 1/1992 | Maston et al. | 206/331 |

Primary Examiner—David T. Fidei
Attorney, Agent, or Firm—Pearson & Pearson

[57] ABSTRACT

A carrier for a flatpack integrated circuit component. The carrier includes a square frame formed of a conductive plastic and a series of electrically isolating comb inserts for supporting terminals from a flat pack integrated circuit component. Elongated slots at each of the corners of the frame support linearly reciprocal slide tabs that move between first and second positions. In the first position a finger from each slide tab overlies the frame member; in a second position the finger overlies either a portion of the component housing or a portion of the comb inserts and at least one terminal from the integrated circuit in the comb at each corner thereby to retain the component in the carrier.

20 Claims, 5 Drawing Sheets

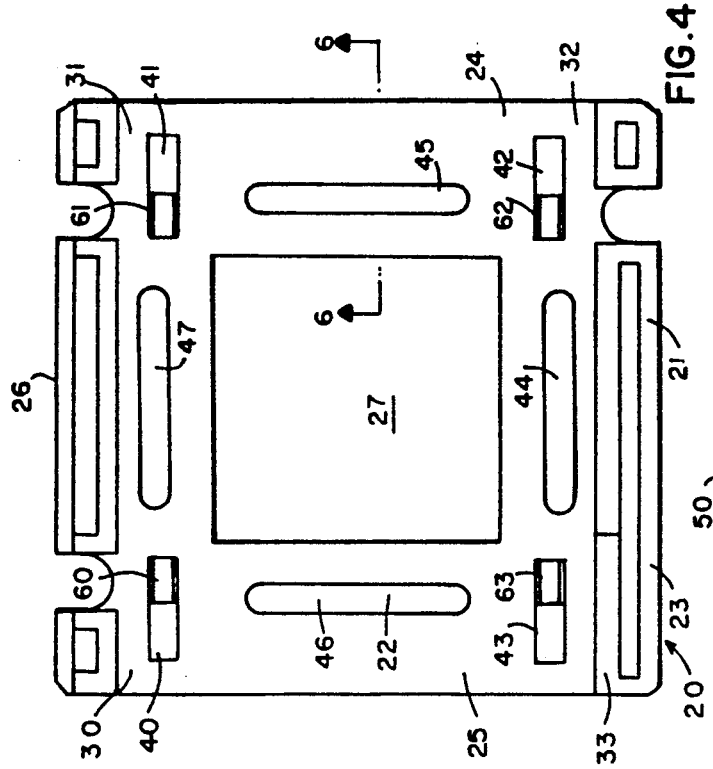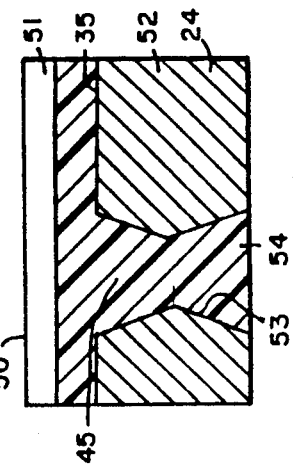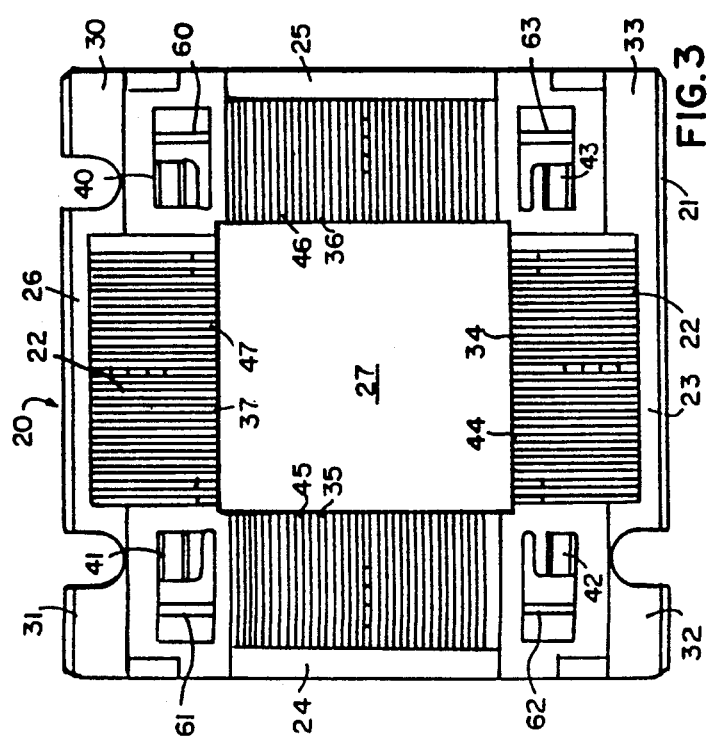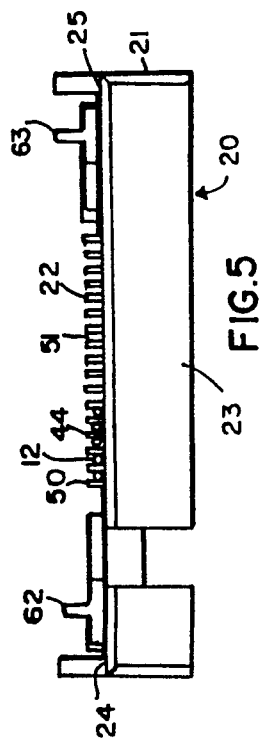

SLIDE TAB CARRIER FOR FLATPACK ELECTRONIC COMPONENT CARRIERS

BACKGROUND OF THE INVENTION

1. Field of the Invention

This invention generally relates to component carriers and more specifically to a system for facilitating the handling of flatpack integrated circuit components during the production of electrical devices.

2. Description of Related Art

Semiconductor devices have matured from simple circuit elements into complex components provided in a variety of integrated circuit packages. This maturation has been accompanied by an increase in the complexity of handling these components during assembly and testing operations. It has become necessary to protect these devices from various sources of mechanical and electrical damage during manufacture and to provide a means for testing individual circuit components during assembly operations.

These needs have led to the development of chip carriers that are special enclosures or packages for housing and protecting an integrated circuit or the like during processing, production, testing and assembly operations. Generally chip carriers orient an integrated circuit during the production process, assure proper placement and alignment of terminals for testing and for insertion into a printed circuit board. Chip carriers eliminate stress from the terminals and seals found in such integrated circuits. Moreover they must now protect a component from mechanical and electrical damage and provide access to all terminals to facilitate component testing.

As the number of circuit designs and packages have proliferated, so have the number of chip carrier configurations. Indeed there are now different chip carrier structures for different integrated circuit packages, including chip carriers exclusively for flatpack integrated circuit components. Flatpack integrated circuit components are characterized by comprising a planar rectangular housing and at least two or four sets of spread, coplanar terminal pins extending from the edges of the housing essentially in the plane of the housing. For example the following patents disclose chip carriers for flatpack electronic circuits that include two or more retention arms:

U.S. Pat. No. 4,379,505 (1983) Alemanni
U.S. Pat. No. 4,591,053 (1986) Alemanni

U.S. Pat. No. 4,379,505 to Alemanni discloses a one-piece integrated circuit carrier including a base with a central opening bounded on opposite ends by walls having a plurality of narrow grooves for receiving the leads of an integrated circuit flatpack component. Resilient retaining fingers at the corners of the central opening extend diagonally into the opening. Each finger has a tip with a flange for fitting over the outermost leads of the flatpack component. The bottoms of the resilient fingers are displaced upward by vertical forces to spread them apart sufficiently and allow a flatpack electronic circuit component to be inserted in the opening. When the force is released, the retaining fingers return to their normal position and extend over the tops of the outermost leads to capture the flatpack package.

U.S. Pat. No. 4,591,053 issued to Alemanni discloses a one-piece circuit carrier including a base with a central opening bounded at opposite ends by walls having narrow parallel elongated grooves for receiving the leads of an integrated circuit. A pair of elongated resilient retaining fingers extend along opposite edges of the opening for connecting to the four outermost leads of the flatpack component to hold it in the carrier. A flatpack component is inserted by pushing generally horizontally outward on the tips of the retaining fingers to spread them apart and allow the flatpack to be inserted. When this horizontal force is removed, restoring forces in the fingers return them to their normal positions extending over and frictionally contacting the outermost leads of the flatpack component.

It has also been proposed to utilize biased pivoted arms to engage other portions of flatpack electronic components as, for example in the following patents:

U.S. Pat. No. 3,604,557 (1971) Cedrone
U.S. Pat. No. 3,652,974 (1971) Tems
U.S. Pat. No. 4,409,733 (1983) Alemanni
U.S. Pat. No. 4,535,887 (1985) Egawa
U.S. Pat. No. 4,556,145 (1985) Putnam
U.S. Pat. No. 4,991,714 (1991) Clatanoff
U.S. Pat. No. 5,026,303 (1991) Matsuoka et al U.S. Pat. No. 3,604,557 to Cedrone discloses a carrier for small objects including flatpack electronic components formed as a distortable parallelogram. When the structure is oriented in a capture position, rabbets overlie a component housing.

U.S. Pat. No. 3,652,974 to Tems discloses a module carrier that includes overlying retaining elements that capture the housing of the electronic circuit component.

U.S. Pat. No. 4,409,733 to Alemanni discloses a carrier for a flatpack component. Upstanding arms deflect pivotally about a horizontal axis to an open position to allow the flatpack to be inserted. When the arms are released, they pivot to the vertical position and lugs at the ends of the arms overlie and engage the housing.

U.S. Pat. No. 4,535,887 to Egawa discloses a carrier for flatpack integrated circuits that includes a receiving section with lead-accommodating grooves for supporting the various leads from the integrated circuit. A pair of pivotally supported latch members with arms that retain the integrated circuit package in the carrier by providing a stable support at each corner of the integrated circuit package. A detent-like mechanism retains the arms in a locked position.

U.S. Pat. No. 4,556,145 to Putnam discloses a one-piece flatpack chip carrier including a pair cantilevered arms having tapered heads for holding chips of varying thicknesses. The arms extend into a carrier central aperture from the top and bottom side of the aperture respectfully Longitudinally offset stops mounted on the arms stabilize a small chip laterally and longitudinally. Chips of varying widths may be held between the heads of the arms up to the width of the central aperture.

U.S. Pat. No. 4,991,714 to Clatanoff discloses a carrier device with a central opening and a pair of beams extending into the opening. Each beam has hooks to grasp a component. A series of interconnected bars join to the beams to allow flexing whereby the carrier is enabled to accept a component between the hooks and to bias the beams toward each other to contain the component.

U.S. Pat. No. 5,026,303 to Matsuoka et al discloses a flatpack integrated circuit carrier. Diagonally disposed, movable flexible arms with engaging claws at an upper free end of each arm engage at upper edge of the corner portion of the integrated circuit housing. .The arms retract or move outwardly along the diagonal lines to enable the insertion and removal of the integrated circuit component.

Somewhat similar structures embodying flexible arms or capture structures for engaging an integrated circuit housing have been proposed for pin grid array integrated circuits. These structures are disclosed in:

U.S. Pat. No. 4,549,651 (1985) Alemanni
U.S. Pat. No. 4,620,632 (1986) Alemanni

The use of flexible or pivoted arms or retaining fingers that rely on the inherent resilience of a molding material can limit the useful life of the carrier. When the material is stressed by bending a finger, the finger does not return to its original position on release. The amount by which a finger fails to return to its original position increases with use. Eventually the finger will not return to a positive locking position whereupon the carrier is no longer useful.

Each of the foregoing patents provides a structure that requires special tooling for use. For example, each requires tools for applying a horizontal or vertical fores to move the retention means to an "open" position to allow the insertion or removal of the component. Such tooling must extend past the same position at which the insertion or removal occurs. Otherwise the bias of the restoring forces in the retention mechanism would close the opening and prevent removal or insertion Other mechanisms for engaging integrated circuit components include those discussed in:

U.S. Pat. No. 4,747,483 (1988) Grabbe
U.S. Pat. No. 4,767,984 (1988) Bakker

U.S. Pat. No. 4,747,483 to Grabbe discloses a carrier for receiving a flatpack integrated circuit component. A stamped metal securing member comprising three spaced, essentially parallel legs secures the integrated circuit component in the carrier. The securing members are separate components that are loaded into the carrier and over the corners of the legs. The middle legs of these securing members and bases of the outer legs are welded to the frame. As a result a force applied a base of each clip produces a stress that pivots the tips of the outer legs about weld points to open the carrier.

U.S. Pat. No. 4,767,984 to Bakker discloses a carrier for a flatpack integrated circuit component that supports the leads. A diagonal slot at each corner of the carrier receives an arm that pivots about an horizontal axis at right angles to a the slot between open and closed positions without introducing any return bias. Thus this structure enables assembly apparatus to open the arms at one location that is remote from a component insertion or removal position. However, the force moving the arm is applied vertically or at right angles to the plane of carrier. Consequently carrier motion must be interrupted to allow the arm to pivot.

Structures involving discrete components such as shown in the Baker and Grabbe patents tend to overcome the limited life of carriers with resilient arms. However, the locking structures require an application of force at right angles to the direction of normal chip carrier motion. This force is not readily applied while the chip carrier is in motion, so the chip carrier must stop along the assembly line to enable the appropriate apparatus to open or close the retaining structure.

SUMMARY

Therefore it is an object of this invention to provide a carrier for a flatpack integrated circuit component that is adapted for automated assembly operations.

Another object of this invention is to provide a carrier for a flatpack integrated circuit component with a locking structure that does not stress the materials of the carrier.

Still another object to this invention is to provide a carrier for a flatpack integrated circuit that enables a retaining or locking structure to open and close while the carriers are moving along a production line.

Yet another object of this invention is to provide a carrier that positively retains a flatpack integrated circuit component in the carrier, that is adapted for automated use and that provides mechanical and electrostatic protection for the component.

In accordance with this invention, a carrier for a flatpack component includes a terminal engagement structure for supporting a plurality of terminals from the flatpack component thereby to support and position the flatpack component in the carrier. A carrier frame circumscribes and supports the terminal engagement structure. Slide tabs mount in the frame adjacent the terminal engagement structure for reciprocal motion between first and second positions parallel to the plane of the frame. In a first position the slide tab is coextensive with the frame. In the second position the slide tab is coextensive with a portion of an area including the terminal engagement means and an adjacent area thereby to retain the circuit component in the carrier.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

FIG. 3 is a top view of the chip carrier frame shown in FIGS. 1 and 2 ;

FIG. 4 is a bottom view of chip carrier shown in FIGS. 1 and 2;

FIG. 5 is a front view of the chip carrier shown in FIGS. 1 and 2;

FIG. 6 is a sectional view taken along lines 6—6 in FIG. 4;

DESCRIPTION OF ILLUSTRATIVE EMBODIMENTS

Figure 1:
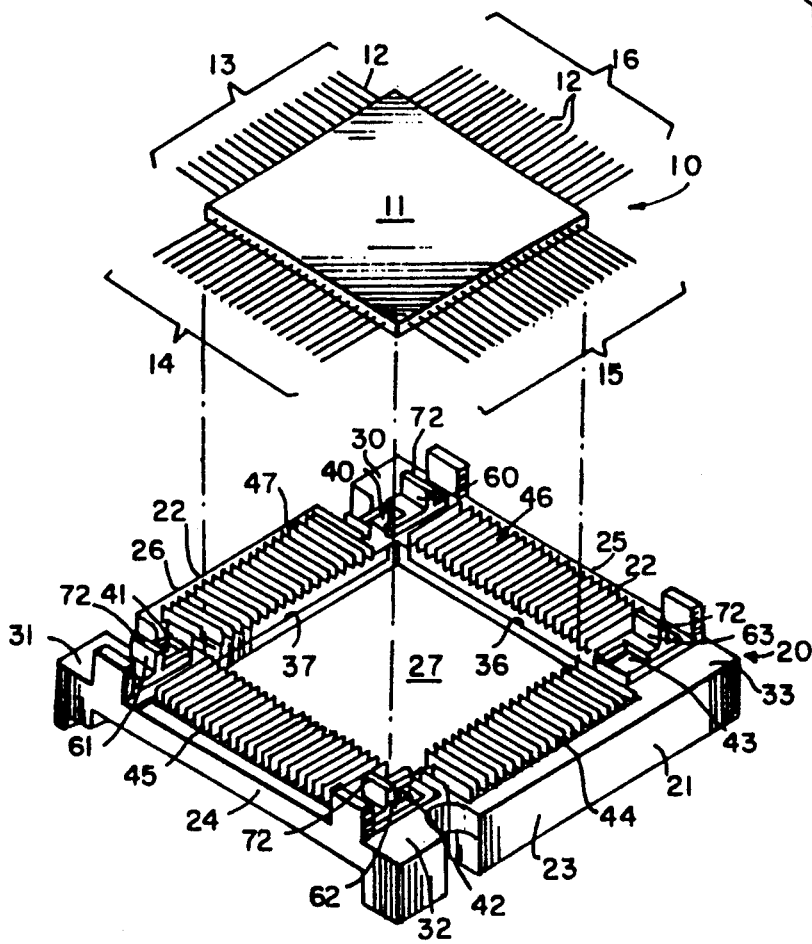
FIG. 1 is a exploded expected view of a flat pack integrated circuit component and chip carrier constructed in accordance with this invention.
Figure 2:
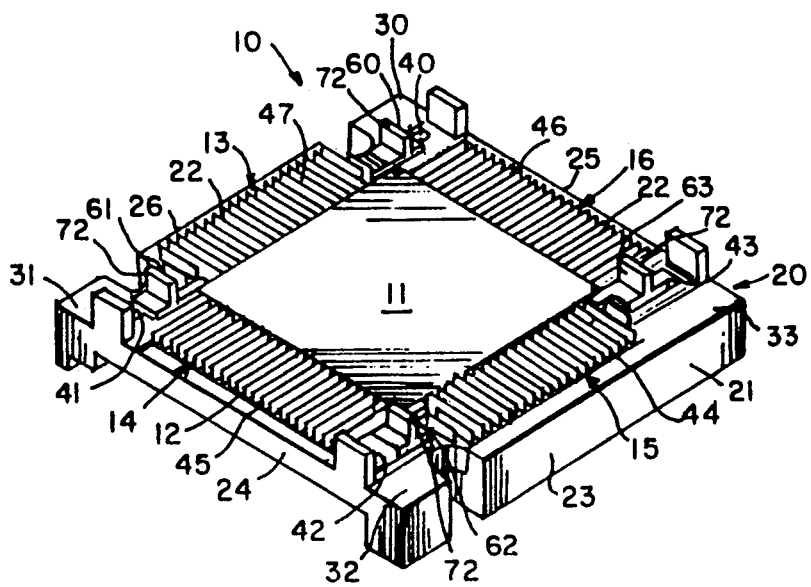
FIG. 2 is a perspective view of component and chip carrier of FIG. 1 in an assembled configuration.
Figure 7:
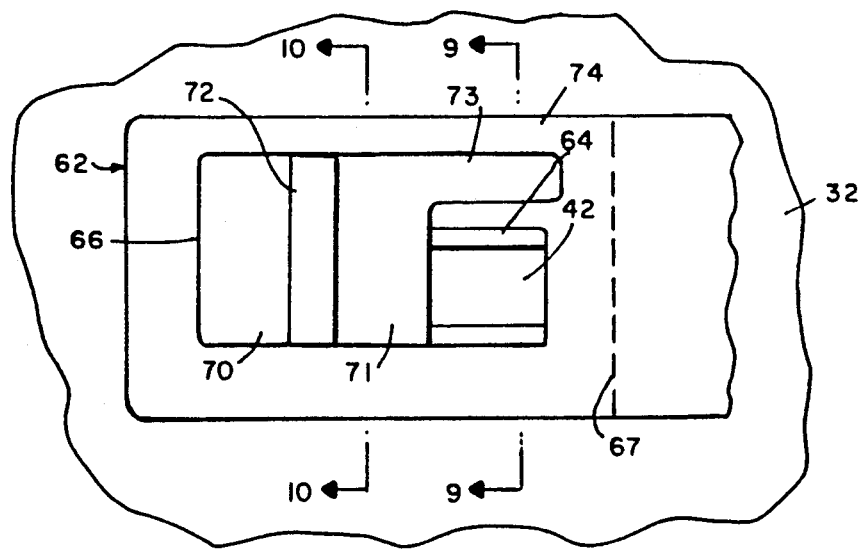
FIG. 7 is a top view taken of a slide tab device shown in FIG. 1 and 2.
Figure 8:
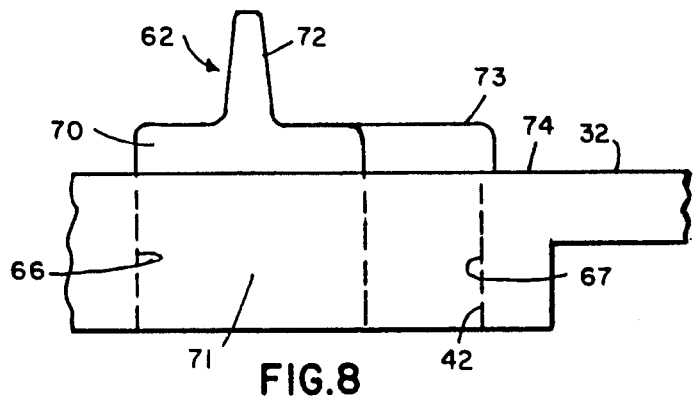
FIG. 8 is an enlarged side view of a portion of the carrier shown in FIGS. 1 and 2.
Figure 9:
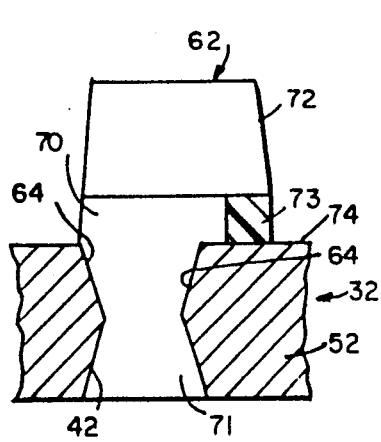
FIG. 9 is a sectional view taken along lines 9—9 in FIG. 7.
Figure 10:
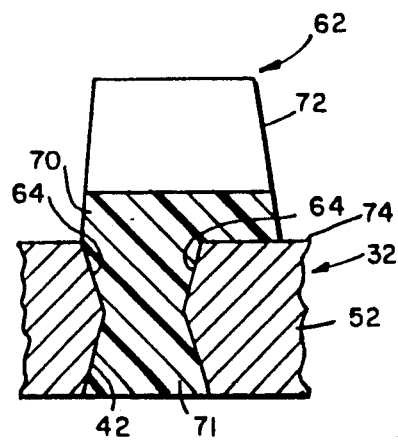
FIG. 10 is a sectional view taken along lines 10—10 in FIG. 7.

As shown in FIGS. 1 and 2, a flatpack integrated circuit component 10 typically comprises a planar ceramic housing 11 and plurality of terminals 12 that extend from the edges of the housing 11. In this particular embodiment the housing 11 supports four sets of leads or terminals, designated by reference numerals 13 through 16 respectively, that project from each edge of the housing 11.

FIGS. 1 through 5 depict an embodiment of this invention adapted for use with flatpack integrated circuit components. Specifically, a carrier 20 formed in accordance with this invention includes a frame member 21 that circumscribes a plurality of terminal engagement or support members 22. The frame member 21 has a generally square configuration defined by sides 23 through 26 that join at corners 30 through 33. More specifically the corner 30 is formed at the junction of sides 26 and 25; the corner 31, of sides 26 and 24; the corner 32, of sides 23 and 24; and the corner 33, sides 23 and 25.

Each of sides 23 through 26 has a centrally disposed recess 34 through 37. Recesses 36 and 37 are shown in sides 25 and 26 in FIGS. 1 and 2; the positions of the other recesses are shown in FIG. 3. These recesses support terminal support members as discussed later. Each of the corners 30 through 33, also include one of slots 40 through 43 respectively. Each of the slots 40 through 43 is elongated and extends parallel to the sides 23 and 26.

Each of the sides 23 through 26 supports insulating or electrically isolating combs 44 through 47 respectively. The insulating combs have recesses that receive the terminals 12 in an electrically isolating fashion. More specifically as shown in FIG. 5, each comb, such as comb 44, comprises a plurality of spaced teeth 50 with intervening spaces 51 that receive one terminal 12 per space.

Each comb is positioned in one of the central recesses formed in the sides. More specifically the combs 46 and 47 are positioned in recesses 36 and 37 of sides 25 and 26 respectively as shown in FIG. 1. Thus it will be apparent that when the flatpack integrated circuit component 10 shown in FIG. 1 is positioned centrally of the carrier 20, the combs 44 through 47 support the terminals 12 in parallel spaced relationships. Moreover when the combs 44 through 47 are formed of an insulating or electrically isolating plastic material, the terminals are electrically isolated and accessible for testing in place.

It will also be evident from FIGS. 1 and 2 that the sides 23 through 26 form a protective structure that minimizes any potential mechanical damage to the integrated circuit. Any potential for electrostatically induced damage is minimized when the frame 21 is formed of a conductive plastic material.

FIG. 6 is a cross section that depicts the relationship between the comb 45 and the supporting side member 24. The insulating material 54 of the comb 45 is molded through an opening with spaced, dovetail surfaces 53 in the conductive plastic 52 that forms the side 24. In one embodiment, the carrier 20 is manufactured by a double injection molding technique. A first molding operation with a conductive plastic material forms the carrier frame member 21 with the central recesses 34 through 37, slots 44 through 47 and slots 40 through 43. In a second molding operation, the frame 21 is placed in a second mold and itself serves as a part of the mold. Insulating plastic 54 is injected to form the combs 44 through 47 against the external mold and to flow through the slots below the central recesses 34 through 37. When the insulating plastic material 54 sets, the combs 44 through 47 are formed and locked in place by the extensions through the slots 44 through 47 as shown in FIG. 6.

Referring again to FIGS. 1 and 2, the carrier 20 includes corner slide tabs 60 through 63 at corners 30 through 33 respectively. FIGS. 7 through 10 depict the structure of these slide tabs in greater detail, particularly slide tab 62 shown in FIGS. 1 through 5. As shown particularly in FIGS. 9 and 10, the conductive plastic material 52 of the frame 21 forms dovetailed surfaces 64 at the slot 42 extending between end walls 66 and 67 in FIG. 8. The elongated slot 42 is parallel the side member 23 and is collinear with the elongated slot 43 as shown in FIGS. 1 and 2. Likewise slots 40 and 41 are collinear and parallel the side member 26.

The slide tab 62 shown in FIGS. 7 through 10 and the remaining slide tabs can be molded with insulating plastic material into the conductive plastic frame member simultaneously with the combs 44 through 47. The molding operation produces a body portion 71 that engages the dovetail 64. However, the insulating plastic material does not bond to the frame 21 so the slide tab 62 is free to reciprocate in the slot 42 because it only partially fills the slot 42 lengthwise.

A vertically oriented operating tab 72 extends upward from the body portion 71 and provides a convenient means for manually moving the slide tab 62 in the slot 42 between a first, or retracted, position where the body portion 71 abuts the end wall 66 and a second, or advanced, position where the body portion 71 abuts the end wall 67. The body portion 71 additionally includes an elongated retaining finger 73 that slides along an upper surface 74 of the corresponding side of the frame number 21. As shown this retaining finger 73 therefore moves with the operating body 71 between its retracted and closed positions.

Figure 11:
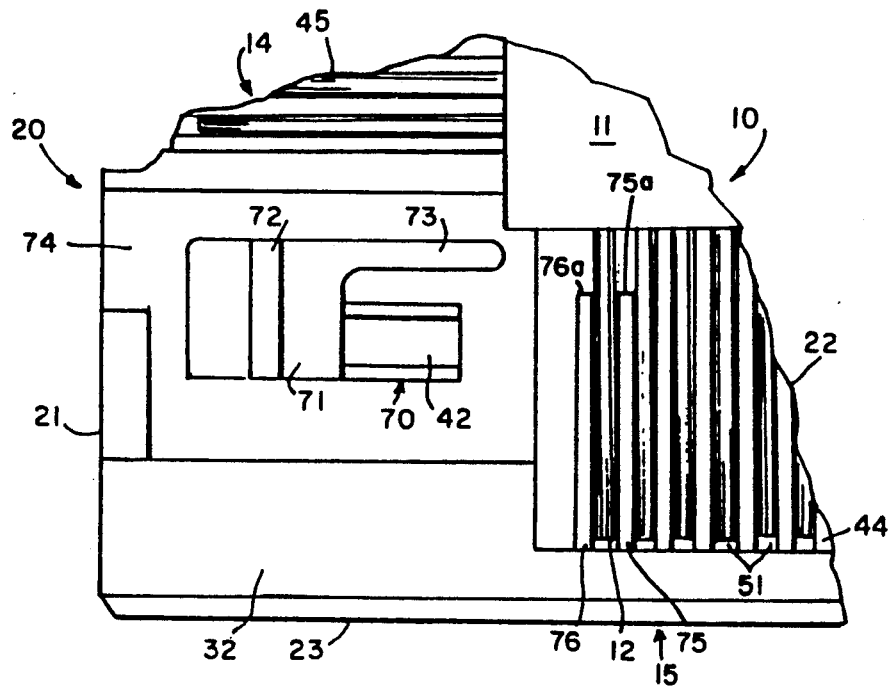
FIG. 11 is a enlarged view of a slide tab carrier constructed in accordance with this invention with a slide tab in an open position.

FIG. 11 depicts the slide tab 70 in its retracted position in the elongated slot 42. The retaining finger 73 does not overlie any of the comb teeth 75 or 76 in the comb 44. Consequently terminals 12 in set 14 lie in individual spaces 51 between adjacent teeth 50. Nothing obstructs motion of the flat pack integrated circuit 10 and housing 11 normal to the plane of the carrier 20.

Figure 12:
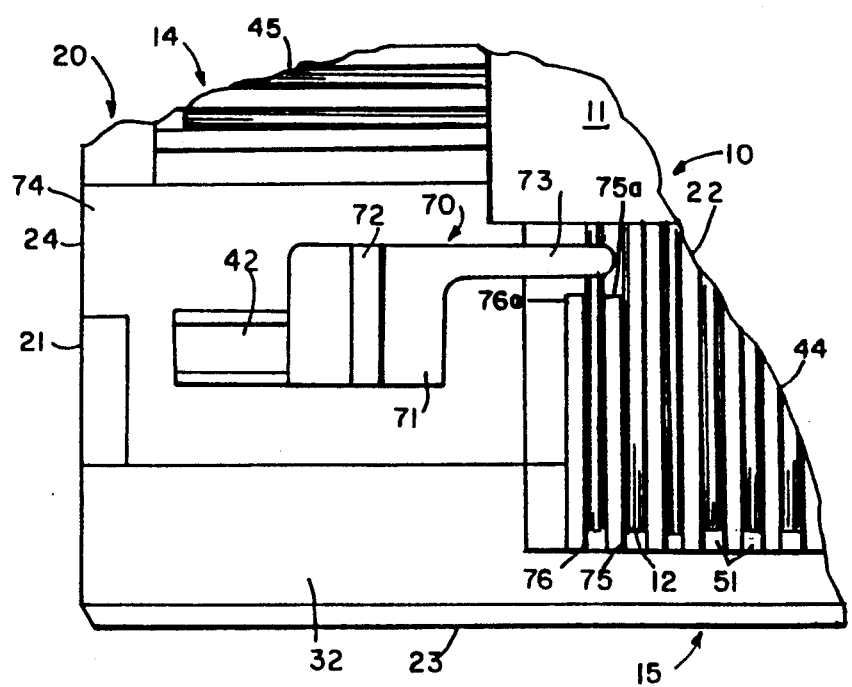
FIG. 12 is an enlarged view of a portion of the carrier of FIG. 11 showing the slide tab in the closed position.

FIG. 12 depicts the slide tab 70 a closed position with the retaining finger 73 positioned to overlie portions of the frame member 21 and portions of the component 10 to capture the component 10 in the carrier 20. When all four slide tabs are in the closed position in this specific embodiment, they capture leads 12 at each corner. As will be apparent from the FIGS. 11 and 12 the ends of comb teeth 75 and 76 adjacent the slide tab 70 can terminate at ends 75a and 76a at a distance from the internal edge of comb 43 adjacent to housing 11 thereby to allow free transfer travel of the fingers 73 past the comb teeth 75 and 76.

The slide tabs shown in FIGS. 7 through 12 are particularly adapted for applications in which a single carrier will receive flatpack components having housings of different thicknesses, as is typical when components are received from different manufacturers. In these applications, industry standards require close adherence to dimensions and spacings for the terminal pins, but not for housings. Consequently a slide tab retaining finger 73 will be able to overlie terminal pins from components having different housings thereby to accommodate and retain a wide variety of components.

Figure 13:
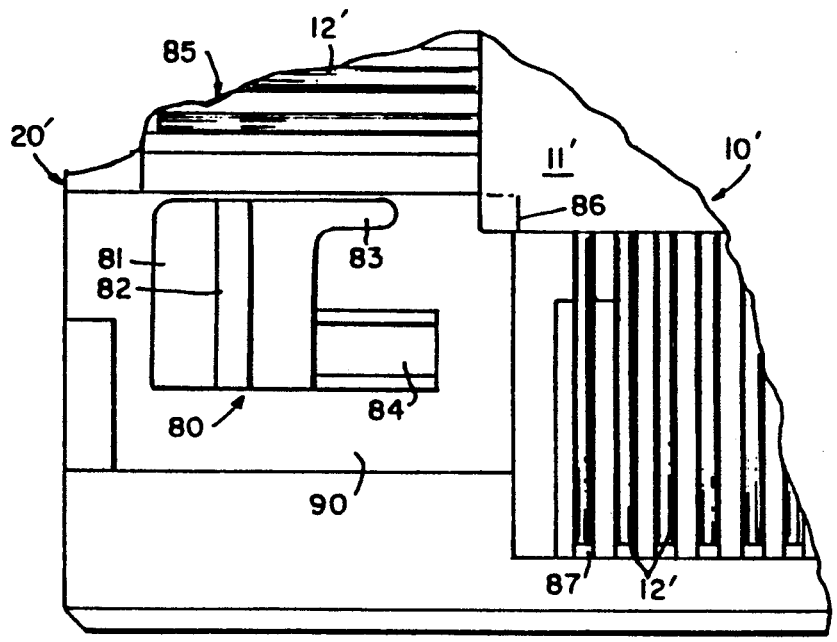
FIG. 13 is an enlarged view of another slide tab carrier constructed in accordance with this invention with a slide tab in an open position.
Figure 14:
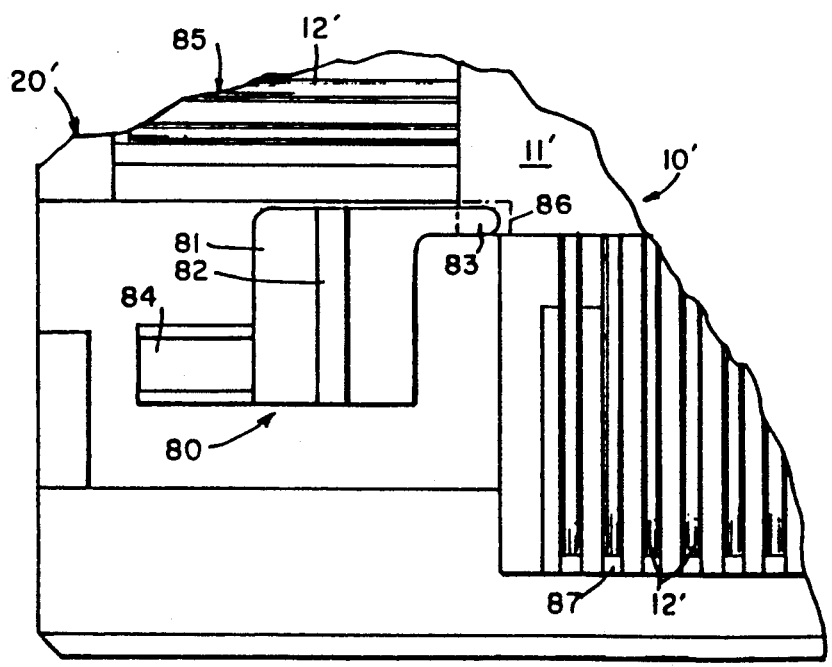
FIG. 14 is an enlarged view of a portion of the carrier of FIG. 13 showing the slide tab in the closed position.

When the carrier is to be used with flatpack components having essentially a constant thickness, the slide tabs can be modified to engage a portion of the housing, rather than the terminal pins One such embodiment is shown in FIGS. 13 and 14. Like the slide tabs shown in FIGS. 11 and 12, this alternative slide tab 80 has a body portion 81, an operating tab 82 and a retaining finger 83. The body portion 81 slides in a slot 84 having a construction that is similar to the slot 42 in FIGS. 11 and 12. In this embodiment, however, the body portion 81 extends toward a comb 85 associated with the carrier 20' that is analogous to the comb 45 in FIGS. 11 and 12. Consequently, the retaining finger 83 moves along a line that overlies an area 86, shown for illustrative purposes as bounded by a dashed line, of the carrier 20' adjacent to a comb 87 corresponding the comb 44 in FIGS. 11 and 12.

In a retracted position, as shown in FIG. 13, the retaining finger 83 only overlies an area defined by a surface 90 of the carrier 20' to allow placement and removal of a component 10' having a housing 11' and terminals 12'. In an extended position, the retaining finger 83 overlies the area 86 that includes a portion of the housing 11', rather than the terminals 12'. This is a preferred engagement point when the thickness of the component housing remains essentially constant because any shock or impact forces are applied to the housing 11' rather than the terminals 12'.

Each of the slide tabs 60 through 63 in FIGS. 1 through 5, whether in the specific form of FIGS. 11 and 12 or the specific form of FIGS. 13 and 14, is linearly reciprocal between a first and a second position. The slide tabs 60 through 63 are held by the relative friction between the structures. It would also be possible to mold detent structures into the dovetail surfaces 64 of FIG. 9 and 10 to provide more positive positioning if desired.

None of the materials in the slide tabs or the frame flexes during use. Consequently the structure has a long life expectancy. Once positioned in an open or closed position, the slide tabs 60 through 63 remain in that position. No self restoring forces are generated or necessary to lock an integrated circuit component in place.

The operating tabs 72 and 82 facilitate both manual and automated operation. For example, a depending linear cam surface extending above the structure can engage and slide each of the operating tabs 72 and 82 to the outside or to the retracted positions. The slide tabs will remain in that position until a component is loaded or unloaded. Thereafter a complementary camming structure can close the slide tabs again without interrupting carrier motion by engaging the operating tabs 72 and 82.

Therefore in accordance with the various aspects of this invention, the slide tab structure of this invention provides a carrier that is readily adapted for automated assembly operations. The carrier provides mechanical and electrostatic protection through its use of the conductive carrier frame and insulating comb structure. The slide tabs, as retaining structures, operate without the introduction of any internal stresses and so are adapted for repeated use. Finally the structure is an integral self-contained structure that does not require the use of separate components which are subject to lose, misuse or breakage during operation.

It will be apparent that a number of variations and modifications can be made to this invention with the attainment of some or all of the objects and advantages of this invention. Structures could be manufactured of different materials. Different configurations for interlocking the slide tabs and the frame member could be utilized. As previously indicated detent structures could be incorporated in the mechanism. Therefore, it is the intent of the appended claims to cover all such variations and modifications as come within the true spirit and scope of this invention.

What is claimed as new and desired to be secured by Letters Patent of the United States is:

1. A carrier facilitating the handling of a flatpack electronic component with a planar housing and a plurality of terminals extending from the edges of the housing in a predetermined configuration, said carrier comprising:

A. terminal engagement means for supporting the plurality of terminals thereby to position the flatpack electronic component in said carrier in a first area adjacent said terminal engagement means, B. frame means for supporting said terminal engagement means and having a slot formed therein along an axis adjacent said terminal engagement means, and C. slide tab means in said frame means adjacent said terminal engagement means for linear reciprocal motion in said slot between first and second positions and parallel to the plane of the planar housing of the flatpack electronic component, said slide tab means including a body extended through and captured by said frame means and linearly slidable in said slot and an extension from said body that overlies said frame means when said slide tab means is in the first position, said extension in the second position is coextensive with and overlies a portion of a second area including a portion of said terminal engagement means and a portion of said first area whereby said slide tab means positions said extension to retain an electronic component in said carrier.

2. A carrier as recited in claim 1 wherein said extension overlies a portion of said terminal engagement means thereby to engage at least one terminal of the electronic component when said slide tab means is in the second position.

3. A carrier as recited in claim 1 wherein said extension overlies an area adjacent said terminal engagement means thereby to engage a portion of the housing of the electronic component when said slide tab means is in the second position.

4. A carrier as recited in claim 1 wherein said slide tab means additionally includes operating means for facilitating the reciprocal motion thereof.

5. A carrier as recited in claim 5 wherein said frame means and said slide tab means are integrally molded of diverse molding materials.

6. A carrier as recited in claim 5 wherein said frame means is molded of a conductive plastic material and said slide tab and said terminal engagement means are molded of an electrically isolating plastic material.

7. A carrier as recited in claim 1 wherein said terminal engagement means defines a rectangular support for the plurality of terminals and a plurality of second areas and wherein said slide tab means comprises a plurality of slide tabs mounted at diverse positions in said frame means, each of said slide tabs being independently reciprocal between first and second positions and each of said slide tabs having an extension that in its first position is coextensive with said frame means and in the second position is coextensive with a portion of a second area including a portion of said terminal engagement means and a portion of the first area whereby each slide tab means can be positioned to engage a portion of an electronic component in said carrier by engaging the component at discrete positions.

8. A carrier as recited in claim 7 wherein each said extension overlies a corresponding portion of said terminal engagement means thereby to engage at least one terminal of the electronic component when said slide tab means is in the second position.

9. A carrier as recited in claim 7 wherein each said extension overlies an area adjacent said terminal engagement means thereby to engage a corresponding portion of the housing of the electronic component when said slide tab means is in the second position.

10. A carrier as recited in claim 7 wherein each said slide tab additionally includes operating means for facilitating the reciprocal motion thereof.

11. A carrier as recited in claim 10 wherein said frame means and said slide tabs are integrally molded of diverse molding materials.

12. A carrier as recited in claim 11 wherein said frame means is molded of a conductive plastic material and said slide tab and said terminal engagement means are molded of an electrically isolating plastic material.

13. A carrier for facilitating the handling of a flatpack electronic component with a planar, rectangular housing and a set of spaced, parallel terminals extending from each edge of the housing, said carrier comprising:
  A. a plurality of open rectangular terminal engagement means for individually supporting each of the plurality of terminals along parallel terminal axes for each set of terminals thereby to position the flatpack electronic component in said carrier with the housing in a first area adjacent said terminal engagement means,
  B. open rectangular frame means formed about the periphery of said terminal engagement means for supporting said terminal engagement means and having a slot formed therein along the axis adjacent each said terminal engagement means, and
  C. a plurality of slide tab means in said frame means adjacent the corners of said terminal engagement means, each said slide tab means being attached for reciprocal motion with respect to said frame means along an slide tab axis normal to the terminal axis of a proximate terminal support position of said terminal engagement means between first and second position, each said slide tab means having a body extended through and captured by said frame means and linearly slidable in said slot and an extension from said body that overlies said frame means when said slide tab means is in the first position and an extension that in the second position is coextensive with and overlies a portion of a second area including a portion of said terminal engagement means and a portion of the first area adjacent thereto whereby said plurality of slide tab means can be positioned to retain an electronic component in said carrier.

14. A carrier as recited in claim 13 wherein certain of said slide tab means mount for reciprocating along co-linear axes and others mount for reciprocating along parallel axes.

15. A carrier as recited in claim 14 wherein each said extension overlies a corresponding portion of said terminal engagement means thereby to engage at least one terminal of the electronic component when said slide tab means is in the second position.

16. A carrier as recited in claim 15 wherein each said extension overlies an area adjacent said terminal engagement means thereby to engage a corresponding portion of the housing of the electronic component when said slide tab means is in the second position.

17. A carrier as recited in claim 14 wherein each said slide tab means additionally includes operating means for facilitating the reciprocal motion thereof.

18. A carrier as recited in claim 17 wherein said frame means and said slide tab means are integrally molded of diverse molding materials.

19. A carrier as recited in claim 18 wherein said frame means is molded of a conductive plastic material and said slide tab means and said terminal engagement means are molded of an electrically isolating plastic material.

20. A carrier for facilitating the handling, by external apparatus, of a flatpack electronic component with a planar, rectangular housing and a set of spaced, parallel terminals extending from each edge of the housing, said carrier comprising:
  A. open rectangular terminal engagement means for individually supporting each of the plurality of terminals along parallel terminal axes for each set of terminals thereby to position the flatpack electronic component in said carrier with the housing in a first area adjacent said terminal engagement means,
  B. open rectangular frame means formed of a first molding material about the periphery of said terminal engagement means for supporting said terminal engagement means, said frame means having a plurality of slots formed therein adjacent said terminal engagement means, each slot having a predetermined length along a slot axis normal to a terminal axis and being formed with spaced wall surfaces having convex cross sections, and
  C. a plurality of integral slide tab means formed of a second molding material for securing an electronic component in said carrier, each said slide tab carrier having:
    i. a body having elongated surfaces with concave cross sections for being captured in said frame means and an extent along the slot axis that is less than the predetermined slot length, said body being disposed for linear reciprocal motion along the slot axis between first and second positions,
    ii. an extension extending from said body for overlying a portion of the electronic component in the second position, and
    iii. an operator extending from said body for being engaged by the external apparatus for moving said slide tab means between said first and second positions, said extension of each said slide tab means in a first position being coextensive with said frame means and in the second position being coextensive with a second area including a portion of said terminal engagement means and of a portion of the first area adjacent thereto whereby said slide tab means is positioned to retain an electronic component in said carrier.

* * * * *